(12) United States Patent
Ling

(10) Patent No.: US 9,397,955 B2
(45) Date of Patent: Jul. 19, 2016

(54) METHOD AND SYSTEM FOR AN ANALOG CROSSBAR ARCHITECTURE

(71) Applicant: Maxlinear, Inc., Carlsbad, CA (US)

(72) Inventor: Curtis Ling, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 146 days.

(21) Appl. No.: 14/246,005

(22) Filed: Apr. 4, 2014

(65) Prior Publication Data

US 2014/0301413 A1   Oct. 9, 2014

Related U.S. Application Data

(60) Provisional application No. 61/808,402, filed on Apr. 4, 2013.

(51) Int. Cl.
*H04L 12/933* (2013.01)

(52) U.S. Cl.
CPC ................... *H04L 49/101* (2013.01)

(58) Field of Classification Search
None
See application file for complete search history.

(56) References Cited

U.S. PATENT DOCUMENTS

| 6,954,163 | B2 * | 10/2005 | Toumazou | G06J 1/00 341/110 |
|---|---|---|---|---|
| 2002/0042256 | A1 * | 4/2002 | Baldwin | H03D 3/008 455/232.1 |
| 2007/0040609 | A1 * | 2/2007 | Taylor | H03F 1/26 330/85 |
| 2008/0101503 | A1 * | 5/2008 | Gupta | H04B 1/005 375/338 |
| 2011/0032022 | A1 * | 2/2011 | Flewelling | H03K 19/001 327/478 |
| 2012/0189084 | A1 * | 7/2012 | Yu | H04L 5/06 375/340 |
| 2013/0100999 | A1 * | 4/2013 | Furuta | H03F 1/0227 375/219 |

* cited by examiner

*Primary Examiner* — Habte Mered
(74) *Attorney, Agent, or Firm* — McAndrews, Held & Malloy

(57) ABSTRACT

Methods and systems for an analog crossbar may comprise, in a wireless device comprising a receiver path with an analog crossbar: receiving a digital signal comprising a plurality of channels; amplifying the received signal; converting the amplified signal to an analog signal; separating the analog signal into a plurality of separate channels; routing the plurality of separate channels to desired signal paths utilizing the analog crossbar; and converting the routed plurality of separate channels to a plurality of digital signals. The analog crossbar may comprise an array of complementary metal-oxide semiconductor (CMOS) transistors. The analog crossbar may comprise a plurality of differential pair signal lines, and a plurality of single-ended signal lines. The received signal may be amplified utilizing a low-noise amplifier (LNA), where a gain level of the LNA may be configurable. The analog signal may be separated into separate channels using a channelizer.

17 Claims, 4 Drawing Sheets

US 9,397,955 B2

METHOD AND SYSTEM FOR AN ANALOG CROSSBAR ARCHITECTURE

CROSS-REFERENCE TO RELATED APPLICATIONS/INCORPORATION BY REFERENCE

This application makes reference to and claims priority to U.S. Provisional Application Ser. No. 61/808,402 filed on Apr. 4, 2013. The above identified application is hereby incorporated herein by reference in its entirety.

FIELD

Certain embodiments of the invention relate to wireless communication. More specifically, certain embodiments of the invention relate to a method and system for an analog crossbar architecture.

BACKGROUND

Crossbars for steering digital signal can be complex and area intensive. Further limitations and disadvantages of conventional and traditional approaches will become apparent to one of skill in the art, through comparison of such systems with some aspects of the present invention as set forth in the remainder of the present application with reference to the drawings.

BRIEF SUMMARY

A system and/or method for an analog crossbar architecture substantially as shown in and/or described in connection with at least one of the figures, as set forth in the claims.

Various advantages, aspects and novel features of the present invention, as well as details of an illustrated embodiment thereof, will be more fully understood from the following description and drawings.

DETAILED DESCRIPTION

Certain aspects of the disclosure may be found in an analog crossbar architecture. Exemplary aspects of the disclosure may comprise in a wireless device comprising a receiver path with an analog crossbar: receiving a digital signal comprising a plurality of channels; amplifying the received signal; converting the amplified signal to an analog signal; separating the analog signal into a plurality of separate channels; routing the plurality of separate channels to desired signal paths utilizing the analog crossbar; and converting the routed plurality of separate channels to a plurality of digital signals. The analog crossbar may comprise an array of complementary metal-oxide semiconductor (CMOS) transistors. The analog crossbar may comprise a plurality of differential pair signal lines, and a plurality of single-ended signal lines. The received signal may be amplified utilizing a low-noise amplifier (LNA), where a gain level of the LNA may be configurable. The analog signal may be separated into separate channels using a channelizer. The digital signal may be received utilizing a single antenna or a plurality of antennas. The analog crossbar may comprise a N×M crossbar, wherein N and M comprise integers. Sample rates of the ADC and the DACs may be equal to or greater than twice the maximum frequency of a desired channel of the received digital signal. Conversion steps of the ADC may be in a known relationship to conversion steps of the DACs. The conversion steps of the ADC may be equal to the conversion steps of the DACs.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figure 1:
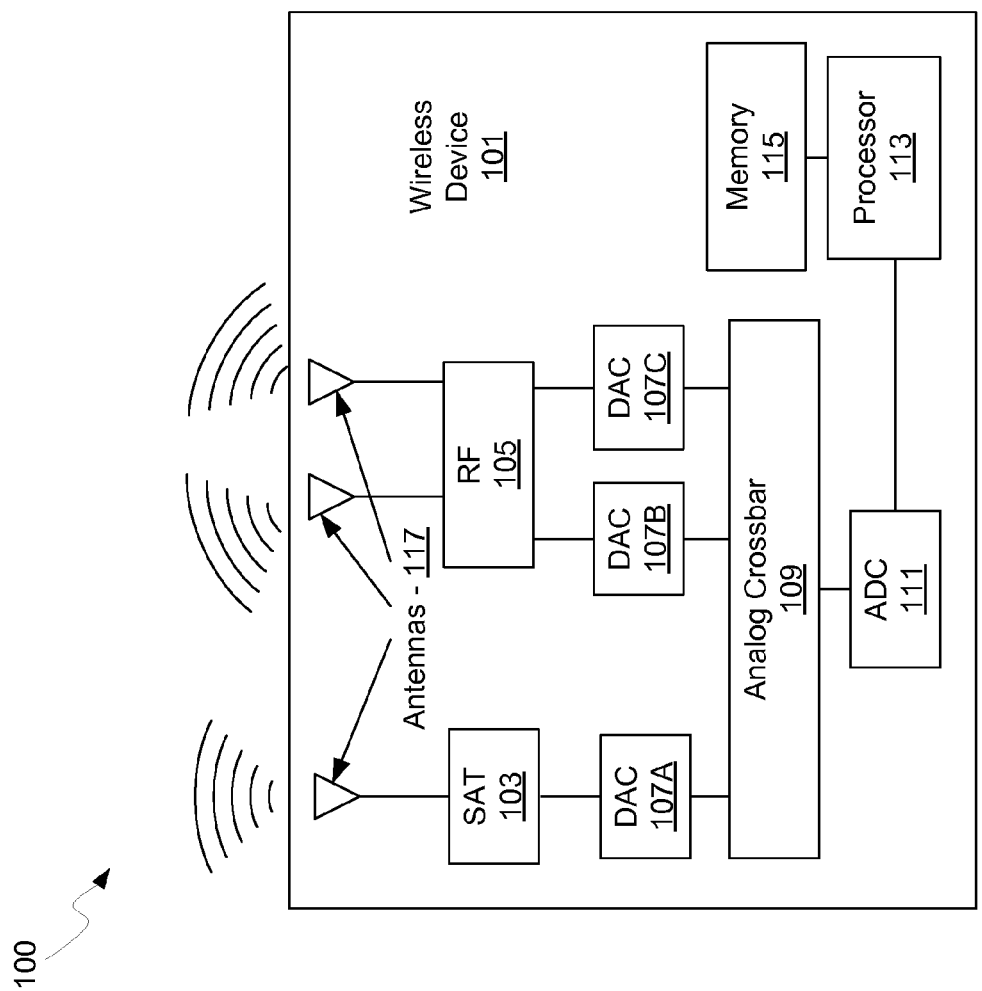
FIG. 1 is a diagram of an example wireless device with an analog crossbar, in accordance with an example embodiment of the disclosure.

FIG. 1 is a diagram of an example wireless device with an analog crossbar, in accordance with an example embodiment of the disclosure. Referring to FIG. 1, there is shown the wireless device 101 comprising a satellite receiver module 103, a radio frequency (RF) module 105, digital-to-analog converters (DACs) 107A-107C, an analog crossbar 109, an analog-to-digital converter (ADC) 111, a processor 113, a memory 115, and antennas 117.

The satellite receiver module 103 may comprise one or more RF receive (Rx) paths for receiving digital signals, such as satellite TV or other RF signals, for example. The satellite receiver module 103 may comprise low-noise amplifiers (LNAs), mixers, local oscillators, variable gain amplifiers, and filters, for example, and thus may be operable to receive RF signals, amplify the signals, and down-convert them to baseband if desired, before communicating an output signal to the DAC 107A.

The RF module 105 may comprise one or more RF receive (Rx) and transmit (Tx) paths for communicating with cellular towers or wireless access points, for example. The RF module 105 may comprise impedance matching elements, LNAs, power amplifiers, variable gain amplifiers, and filters, for example. The RF module 105 may thus be operable to receive, amplify, and filter RF signals before communicating them to the DACs 107A and/or 107B.

The DACs 107A-107C may comprise suitable circuitry, logic, and/or code for converting received digital signals to analog waveforms. Within a digital processing path, there may be a need to couple any one or more of a plurality of digital signals to any one or more of a plurality of signal paths. Circuitry used to perform such function is often termed a "crossbar." Where each digital signal is a multi-bit bus, the traces and switches for such signal routing can become extremely complex. Accordingly, the DACs 107A-107C may be utilized to convert the digital signals to analog representations at the input of the crossbar 109, routing the analog signals within the crossbar 109, and then converting the signals at outputs of the crossbar 109 back to digital at the ADC 111.

Accordingly, the crossbar 109 may comprise an array of switches and signal paths for receiving a plurality of signals and routing then to a plurality of outputs. In an example scenario, the switches in the crossbar 109 may comprise CMOS transistors on the same chip as the other blocks in the wireless device 101.

The ADC 111 may comprise suitable circuitry, logic, and/or code for converting one or more received analog signals and converting them to digital signals. In another example scenario, the analog crossbar 109 may comprise a plurality of outputs to a plurality of ADCs.

The processor 113 may comprise a general purpose processor, such as a reduced instruction set computing (RISC) processor, for example, that may be operable to control the functions of the wireless device 101. For example, the processor 113 may configure the analog crossbar 109 by activating and deactivating appropriate switches to select desired Rx paths. Additionally, the processor 113 may demodulate digital signals received from the ADC 111. However, the disclosure is not limited to a particular type of processor, and other processors are also contemplated (e.g., an application specific processor (such as an ASIC), a digital signal processor (DSP), a CPU, digital logic, etc.).

The memory 115 may comprise a programmable memory module that may be operable to store software and data, for example, for the operation of the wireless device 101. Furthermore, the memory 115 may store configurations of the analog crossbar 109 for receiving desired signals via the antennas 117 and associated Rx circuitry.

The antennas 117 may comprise a plurality of antennas for receiving RF signals in the wireless device 101. Each antenna may be coupled to a plurality of Rx paths in the satellite receiver module 103 and/or the RF module 105, thereby enabling the wireless device to receive a plurality of different frequency signals. The antennas 117 may be internal and/or external to the wireless device 101. In another example scenario, the antennas 117 may be integrated into a single antenna.

Figure 2:
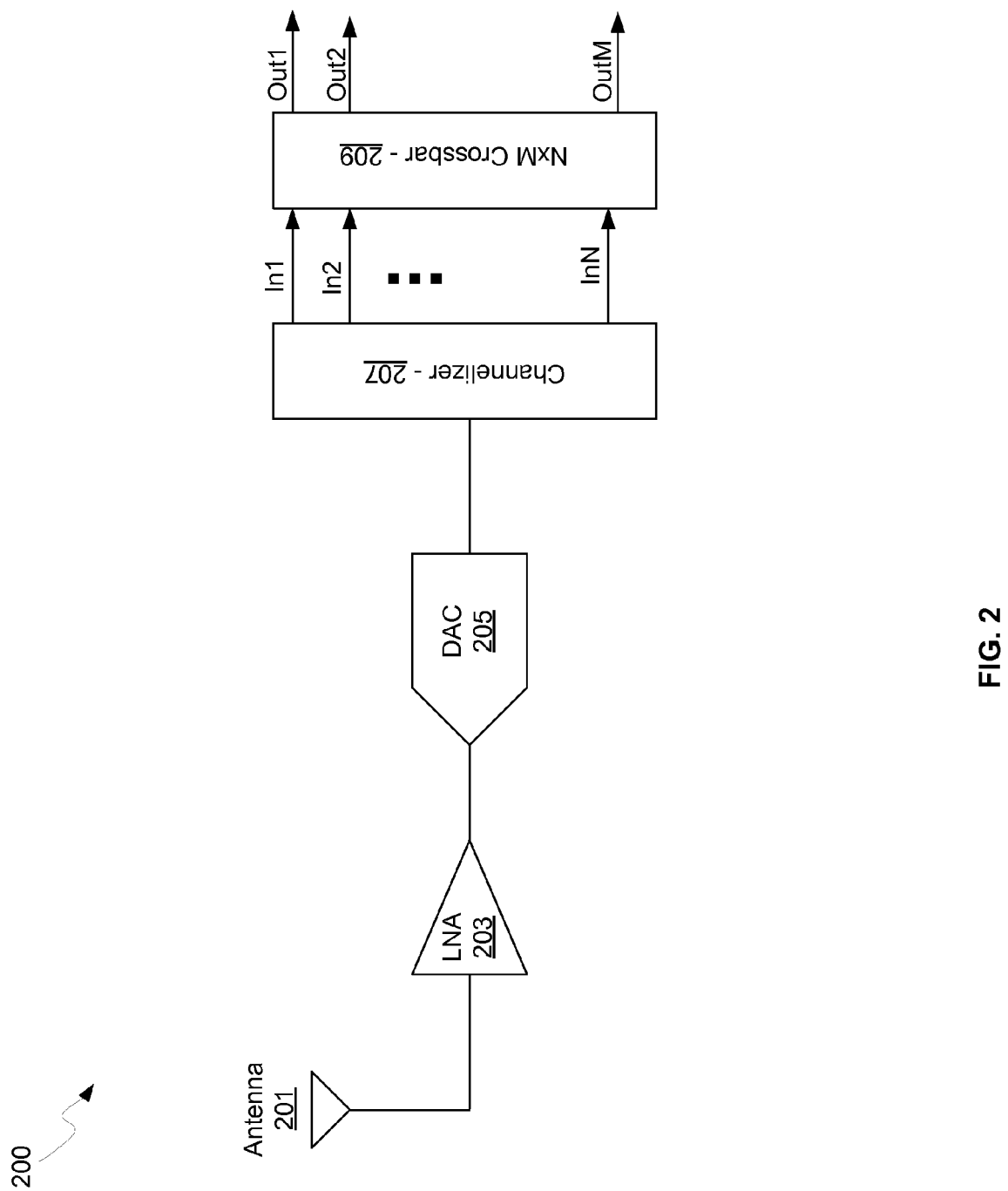
FIG. 2 is a schematic illustrating a receive path with an analog crossbar, in accordance with an example embodiment of the disclosure.

FIG. 2 is a schematic illustrating a receive path with an analog crossbar, in accordance with an example embodiment of the disclosure. Referring to FIG. 2, there is shown a receive path 200 comprising an antenna 201, a low-noise amplifier (LNA) 203, a DAC 205, a channelizer 207, and an N×M crossbar 209.

The antenna 201 may be similar to the antennas 117 described with respect to FIG. 1, for example, and may be operable to receive a plurality of digital signals to be processed by the receive path 200. The antenna 201 may comprise a single antenna with wide enough bandwidth to receive signals of different frequency, or may comprise a plurality of antennas. The LNA 203 may comprise suitable circuitry for amplifying the signals received from the antenna 201. In an example scenario, the LNA 203 may be configured at different gain levels depending on the received signal strength.

The DAC 205 may be similar to the DACs 107A-107O and may be operable to receive amplified digital signals from the LNA 203 and convert them to analog signals to be communicated to the channelizer 207. In an example scenario, the signal lines may comprise differential pair lines, or alternatively may be single-ended.

The channelizer 207 may comprise suitable circuitry for receiving a signal comprising a plurality of signals, at different frequencies or channels, for example, and separating them into individual channels for processing in different paths. Accordingly, the channelizer 207 may receive an analog signal from the DAC 205, separate the received signal into a plurality of signals In1-InN that may be communicated to the N×M crossbar 209.

The crossbar 209 may be similar to the crossbar 109, for example, and may connect each of channels "In_1" through "In_N" to any of signal paths "Out_1" through "Out_M," where each signal "In" and "Out" comprises a k-bit digital signal.

A conventional crossbar in the digital domain connects k signal traces of each input to k signal traces of each output. Obviously, as k gets larger, the complexity grows rapidly. However, in the analog domain, the crossbar 209 merely switches a differential pair of signal lines of each input to a differential pair of each output.

Figure 3:
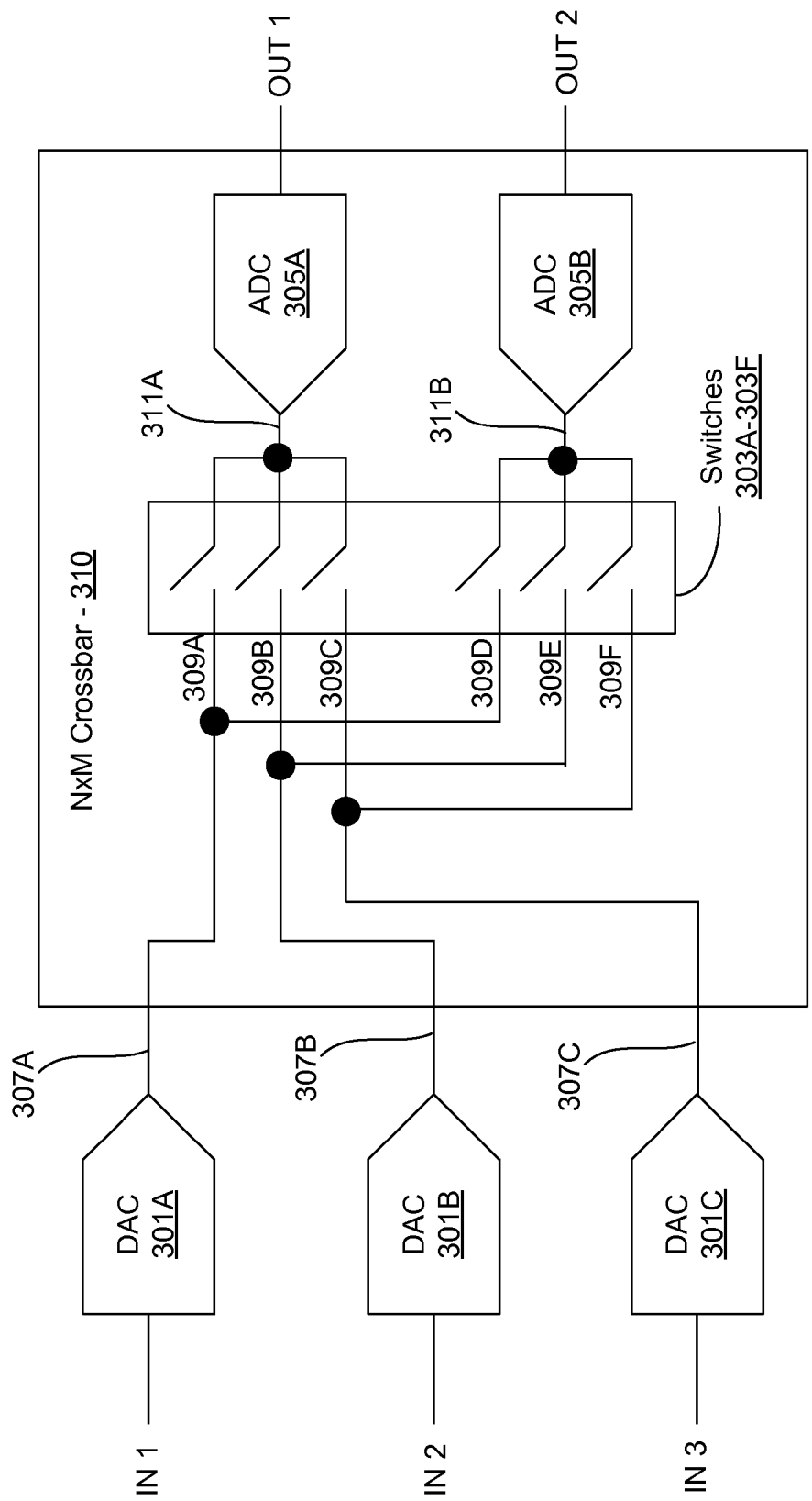
FIG. 3 is a schematic illustrating an N×M analog crossbar, in accordance with an example embodiment of the disclosure.

FIG. 3 is a schematic illustrating an N×M analog crossbar, in accordance with an example embodiment of the disclosure. Referring to FIG. 3, there is shown DACS 301A-301C and an N×M crossbar 310.

The N×M analog crossbar 310 may comprise a plurality of switches 303A-303F, where M=3 and N=2 in this example, and may be operable to receive any input over a digital bus IN 1-IN 3 and switch it to one of the outputs Out 1 or Out 2. In this example, the N×M analog crossbar 310 also comprises the ADCs 305A and 305B for converting the switched signals back to the digital domain for processing by a processor, such as the processor 113, for example.

Using the architecture of FIG. 3, only a differential pair 309A-309F of the input to the switches 303A-303F may be connected to a differential pair 311A or 311B of the output. Thus, for k>2, the reduction in complexity for the architecture of FIG. 3 as compared to a conventional crossbar increases as k increases. In some instances, single-ended signaling may be sufficient within the crossbar 310 and complexity is further reduced relative to a conventional digital crossbar.

In an example implementation, the DACs 301A-301C may use oversampling to gain additional resolution to compensate for aliasing or other non-idealities which may occur from the conversions and/or while the signals are conveyed in the analog domain.

In another example scenario, the sample rates for the DACS 301A-301C and ADCs 305A and 305B may be set to be greater than or equal to twice the maximum frequency of the desired signal without the need for antialiasing filters, because the ADC and DAC may be synchronized and transmitting/receiving well-known signals with controlled bandwidths (i.e. DAC 301A-301C sample rate could be equal to or an integer multiple of the ADC 305A and/or 305B).

In yet another example scenario, the DACS 301A-301O and ADCs 305A and 305B may be set to have conversion steps which are at a known relationship to each other, where in the simple case they are equal to each other so very little additional quantization noise may be introduced during the data conversions.

Digital signals received over one of the digital busses, IN 1-IN 3, split into a plurality of lines, and digitized to the appropriate resolution, depending on noise, bandwidth, and power tradeoffs. While two outputs are shown in this example, any number may be utilized.

Figure 4:
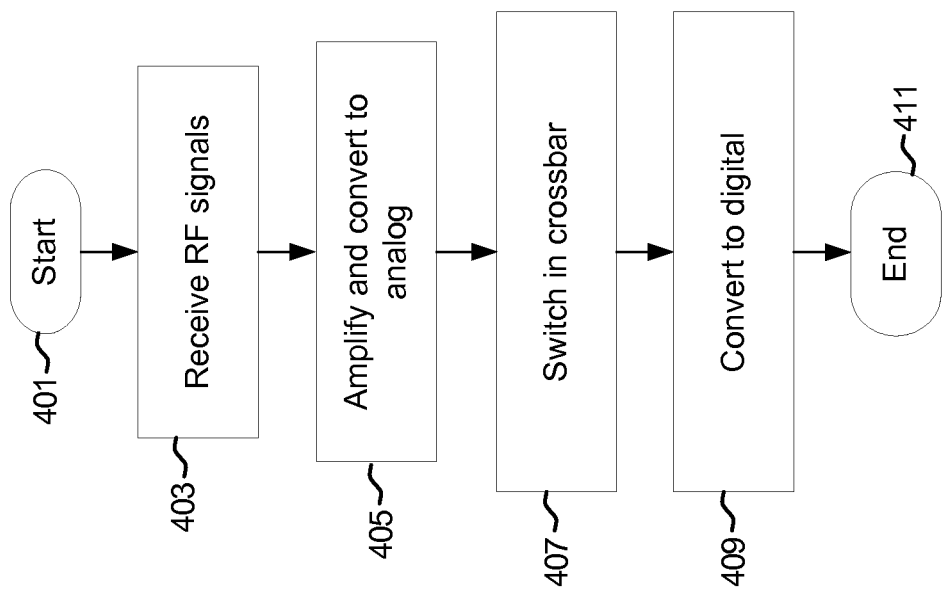
FIG. 4 is a flow diagram illustrating example steps in a digital receive path with an analog crossbar, in accordance with an example embodiment of the disclosure.

FIG. 4 is a flow diagram illustrating example steps in a digital receive path with an analog crossbar, in accordance with an example embodiment of the disclosure. Referring to FIG. 4, after start step 401, in step 403, a digital RF signal comprising a plurality of channels may be received. In step 405, the received signal may be amplified and converted to the analog domain using a DAC.

In step 407, the analog signal may be channelized, i.e., separated into respective channels, and then switched to desired signal paths utilizing an analog crossbar. The signals switched to desired paths may then be converted back to the digital domain utilizing an ADC for subsequent digital processing such as decoding or demodulation, followed by end step 411.

In an embodiment of the disclosure, a method and system may comprise in a wireless device comprising a receiver path with an analog crossbar: receiving a digital signal comprising a plurality of channels; amplifying the received signal; converting the amplified signal to an analog signal; separating the analog signal into a plurality of separate channels; routing the plurality of separate channels to desired signal paths utilizing the analog crossbar; and converting the routed plurality of separate channels to a plurality of digital signals.

The analog crossbar may comprise an array of complementary metal-oxide semiconductor (CMOS) transistors. The analog crossbar may comprise a plurality of differential pair signal lines, and a plurality of single-ended signal lines. The received signal may be amplified utilizing a low-noise amplifier (LNA), where a gain level of the LNA may be configurable. The analog signal may be separated into separate channels using a channelizer. The digital signal may be received utilizing a single antenna or a plurality of antennas. The analog crossbar may comprise a N×M crossbar, wherein N and M comprise integers.

Sample rates of the ADC and the DACs may be equal to or greater than twice the maximum frequency of a desired channel of the received digital signal. Conversion steps of the ADC may be in a known relationship to conversion steps of the DACs. The conversion steps of the ADC may be equal to the conversion steps of the DACs.

Other embodiments may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for an analog crossbar architecture.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
in a wireless device comprising a receiver path with an N×M analog crossbar:
receiving a digital signal via a plurality of antennas, the digital signal comprising a plurality of channels;
amplifying the received signal utilizing a low-noise amplifier (LNA);
converting the amplified signal to an analog signal utilizing a digital-to-analog converter (DAC);
separating the analog signal into a plurality of separate channels utilizing a channelizer;
routing the plurality of separate channels to desired signal paths utilizing the N×M analog crossbar; and
converting the routed plurality of separate channels to a plurality of digital signals utilizing analog-to-digital converters (ADCs).

2. The method according to claim 1, wherein the analog crossbar comprises an array of complementary metal-oxide semiconductor (CMOS) transistors.

3. The method according to claim 1, wherein the analog crossbar comprises a plurality of differential pair signal lines.

4. The method according to claim 1, wherein the analog crossbar comprises a plurality of single-ended signal lines.

5. The method according to claim 1, wherein a gain level of the LNA is configurable.

6. The method according to claim 1, wherein sample rates of the ADC and the DACs are equal to or greater than twice the maximum frequency of a desired channel of the received digital signal.

7. The method according to claim 1, wherein conversion steps of the ADC are in a known relationship to conversion steps of the DACs.

8. The method according to claim 7, wherein the conversion steps of the ADC are equal to the conversion steps of the DACs.

9. A system for communication, the system comprising:
a wireless device comprising a receiver path with an N×M analog crossbar, said wireless device being operable to:
receive a digital signal via a plurality of antennas, the digital signal comprising a plurality of channels;
amplify the received signal utilizing a low-noise amplifier (LNA);
convert the amplified signal to an analog signal utilizing a digital-to-analog-converter (DAC);

separate the analog signal into a plurality of separate channels utilizing a channelizer;
route the plurality of separate channels to desired signal paths utilizing the N×M analog crossbar; and
convert the routed plurality of separate channels to a plurality of digital signals utilizing analog-to-digital converters (ADCs).

10. The system according to claim 9, wherein the analog crossbar comprises an array of complementary metal-oxide semiconductor (CMOS) transistors.

11. The system according to claim 9, wherein the analog crossbar comprises a plurality of differential pair signal lines.

12. The system according to claim 9, wherein the analog crossbar comprises a plurality of single-ended signal lines.

13. The system according to claim 9, wherein a gain level of the LNA is configurable.

14. The system according to claim 9, wherein sample rates of the ADC and the DACs are equal to or greater than twice the maximum frequency of a desired channel of the received digital signal.

15. The system according to claim 9, wherein conversion steps of the ADC are in a known relationship to conversion steps of the DACs.

16. The system according to claim 15, wherein the conversion steps of the ADC are equal to the conversion steps of the DACs.

17. A system for communication, the system comprising:
a wireless device comprising a receiver path with a N×M analog crossbar, said wireless device being operable to:
receive a digital signal via a plurality of antennas, the digital signal comprising a plurality of channels;
amplify the received signal utilizing a low-noise amplifier (LNA);
convert the amplified signal to an analog signal;
separate the analog signal into a plurality of separate channels utilizing a channelizer;
route the plurality of separate channels to desired signal paths utilizing the N×M analog crossbar; and
convert the routed plurality of separate channels to a plurality of digital signals.

* * * * *